United States Patent [19]

Okazaki

[11] Patent Number: 5,646,681
[45] Date of Patent: Jul. 8, 1997

[54] ELECTRONIC PARTS DATA RECORDER AND A MOUNTER EMPLOYING THE RECORDER

[75] Inventor: Shinichi Okazaki, Shizuoka, Japan

[73] Assignee: Tenryu Technics Co., Ltd., Shizuoka, Japan

[21] Appl. No.: 326,081

[22] Filed: Oct. 19, 1994

[30] Foreign Application Priority Data

Oct. 21, 1993 [JP] Japan .................. 5-263529

[51] Int. Cl.$^6$ .......................................... H04N 7/18
[52] U.S. Cl. ........................... 348/87; 348/130; 382/151
[58] Field of Search ................... 348/87, 86, 94, 348/129, 130, 92, 93, 95, 126, 91; 382/145, 146, 147, 149, 151, 181; 29/833, 834, 740, 741

[56] References Cited

U.S. PATENT DOCUMENTS

| | | | |
|---|---|---|---|
| 4,628,464 | 12/1986 | McConnell | 348/87 |
| 4,675,993 | 6/1987 | Harada | 348/87 |
| 5,113,565 | 5/1992 | Cipolla et al. | 348/87 |
| 5,122,971 | 6/1992 | Kamejima et al. | 348/95 |
| 5,137,362 | 8/1992 | LeBeau | 348/126 |
| 5,212,881 | 5/1993 | Nishitsuka . | |
| 5,459,794 | 10/1995 | Ninomiya et al. | 348/87 |

FOREIGN PATENT DOCUMENTS

| | | |
|---|---|---|
| 0341944A3 | 11/1989 | European Pat. Off. . |
| 2169422 | 7/1986 | United Kingdom . |

*Primary Examiner*—Amelia Au
*Attorney, Agent, or Firm*—McCormick, Paulding & Huber

[57] ABSTRACT

The present invention includes a parts data recorder and a mounter which can get the parts data of the electronic parts automatically by processing the picture information which is obtained by the camera for recording the electronic parts. The chip (C) which are put on the parts stage 1 are carried to the mounting stage 3 by the mounter 2, and mounted on the printed circuit board 4. The chip (C) are recorded by the camera, which is provided between the parts stage 1 and the mounting stage 3 in the conveyance path. The parts data is extracted from the picture information which is recorded by the video camera 7. The picture information is stored in the memory. Consequently, it is possible to extract the parts data without key operation and the like.

8 Claims, 13 Drawing Sheets

Fig. 3

| | part data |
|---|---|
| A | width of a molded portion |
| B | length of a molded portion |
| D | chip width |
| E | chip length |
| F | lead connecting face length |
| G | lead width |
| I | lead interval |
| J | width between lead to lead |
| K | length between lead to lead |
| L | number of lead in width direction |
| M | number of lead in length direction |

Fig. 9 ( a )
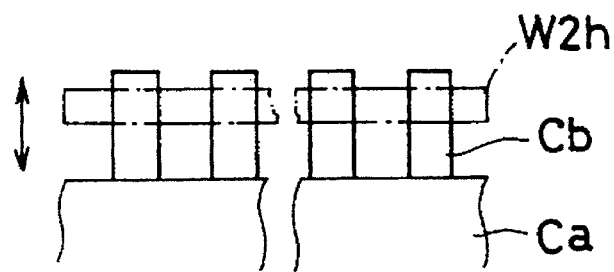
Fig. 9 ( b )
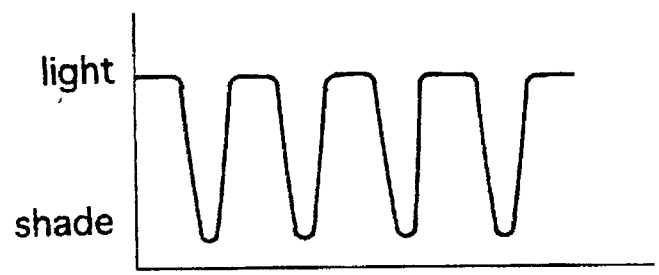
Fig. 9 ( c )
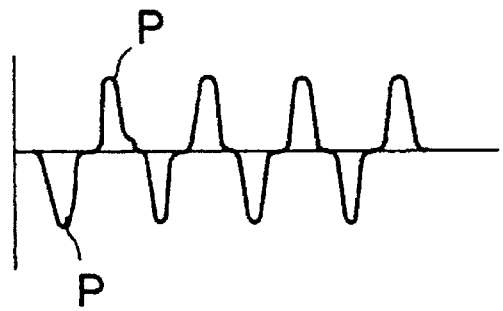
Fig. 9 ( d )
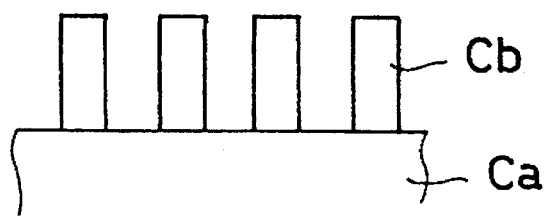

Fig. 10 ( a )
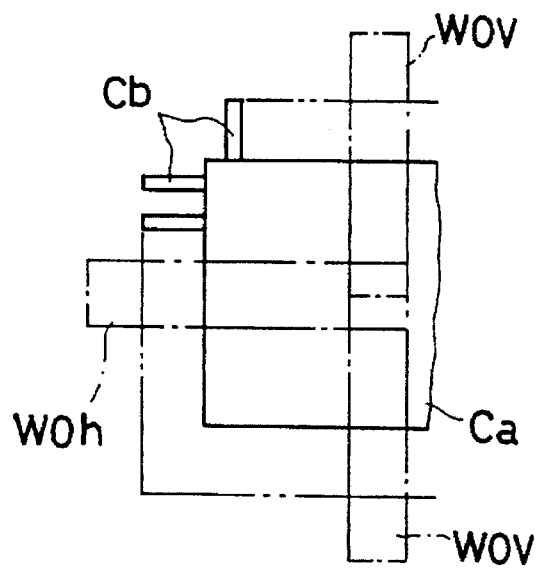
Fig. 10 ( b )
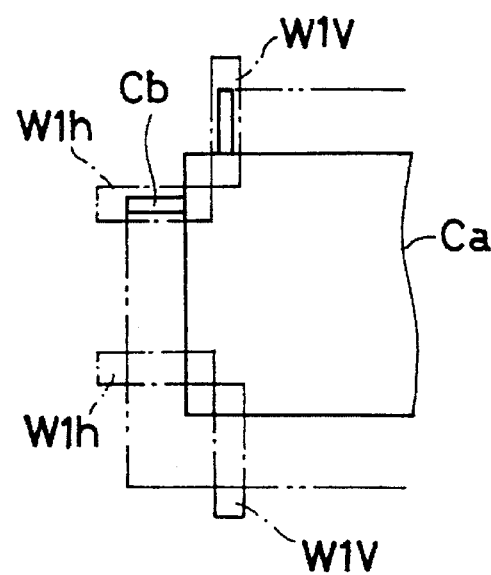
Fig. 10 ( c )
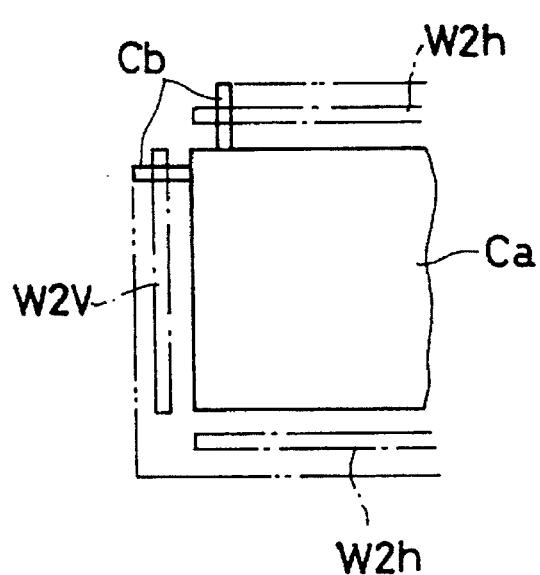

5,646,681

ELECTRONIC PARTS DATA RECORDER AND A MOUNTER EMPLOYING THE RECORDER

BACKGROUND OF THE INVENTION

1. Field of the Invention

This invention relates to a parts data recorder and a mounter employing the mounter, more particularly, to an art for mounting packaged IC, LSI and the like, on the printed circuit board.

2. Description of Related Art

Electronic parts such as IC comprises: a main portion, that is to say, a molded portion, which is a rectangular shape in plan view; and a plurality of leads, each of which is protruding from the outer circumference of the molded portion. When mounting such electronic parts on the printed circuit board, the electronic parts (e, g, one IC chip) is carried from a parts stage, on which the plural electronic parts is put to a print stage on which the printed circuit boards are held by using a chip mounter.

In general, the chip mounter has a mount head which is provided with a vacuum bit which vacuums the electronic parts; this mount head is provided with a centering apparatus which mechanically positions the electronic parts at the predetermined reference point and the predetermined posture.

However, the centering apparatus has a positioning member which touches the electronic parts. This positioning member makes the leads of the electronic parts bend.

The present inventor examined an art, in which only, the vacuuming is done without the centering, the position and the posture of the electronic parts which is held by the chip mounter are detected by using a camera, the electronic parts is mounted on the printed circuit board, and the drift of the mount head with respect to the reference position is adjusted when mounting the electronic parts on the printed circuit board.

However, for the computing of the shape and the measurement by processing the picture information which is extracted by using the video camera, it is necessary to prepare the measurement of all of the electronic parts which is mounted and to input the data of the measurement and the like using a keyboard, or to prepare a library thereof.

Accordingly, in the case in which the users of the mounter of the electronic parts is not assigned; the operator has to key in the data of the electronic parts which may be mounted so as to correspond to all of the users; however, this is impossible because there many types of electronic parts. Further, even in the case in which the users of the mounter of the chip (C) can be assigned, the operator has to alter the data of the parts at every alteration of the electronic parts, so that the operability is poor and the burden on the operator is large.

SUMMARY OF THE INVENTION

It is an object of the present invention to provide a parts data recorder which can read the data of parts the stage by using a video camera.

It is an other object of the present invention to provide a mounter which can automatically detect the distinction of the kind of electronic parts and the posture thereof with respect to the mounter, when electronic parts is being mounted on the printed circuit board, by getting the picture information of the shape, the measurement and the like of the electronic parts in the state to be held by a mounter, and by measuring the posture of the electronic parts with respect to the mounter.

The object and the novel characterizing part of the present invention may be made clear by the description of the specification and the figures.

The outline of the representative characteristics of the present invention disclosed in the present application is as described below.

So as to satisfy this object, the present invention provides a parts data recorder comprising: a recording means, which records a picture of an electronic parts mounted on a mounted part; a picture information memory, which stores the picture information of one frame of the electronic parts; a parts data computing means, which reads the picture information of the specific region from the picture information of one frame, and computes the parts data of the electronic parts; and a parts data memory, which stores the parts data computed by the parts data computing means.

Further, a mounter comprising: a recording means, which records picture information of an electronic parts mounted on a mounted part; a picture information memory, which stores the picture information of one frame of the electronic parts; a parts data computing means, which reads the picture information of the specific region from the picture information of one frame, and computes the parts data of the electronic parts; a parts data memory, which stores the parts data computed by the parts data computing means; a mounting means, which mounts the electronic parts put on a stage on the mounted part put on the mounting stage; a drift quantity computing means, which computes the quantity of the drift between a position of the electronic parts which is in a state to be held by the mounting means and a reference point of the mounting means in accordance with the parts data; and an adjustment value computing means, which computes an adjustment value of the electronic parts with respect to the reference points in accordance with the quantity of the drift.

According to the parts data recorder in accordance with the present invention, the picture information of one frame of the electronic parts, which is recorded by the recording means such as a video camera, a camera is stored in the memory, and the stored parts data is computed from the picture information. Thus, the key operating of the parts data by the operator is unnecessary, and the operation of the extraction of the parts data is greatly improved.

In the mounter having the above construction, it is possible to detect what kind of electronic parts is being mounted, and whether the electronic parts is in a state to be held at the predetermined position with respect to the mounter or be not done, by comparison between the stored parts data and the picture information data of the electronic parts in the conveyance path. Further, it is possible to conduct accurate positioning with respect to the mounted part on which the electronic parts should be mounted, in conformity with the detected drift.

(1) Since the parts data of the chip can be extracted by processing the picture information which is recorded by the recording means; extracting the parts data of the electronic parts by the operator in advance is unnecessary, and it is possible to lessen the burden on the operator.

(2) Since the parts data is extracted from the electronic parts which is actually mounted, it is possible to avoid error between the parts data and the measurement value of the electronic parts.

(3) Since the mounter for mounting the electronic parts on the printed circuit board and the like has the function of a memory storing the parts data; it is possible to judge whether the electronic parts is correct or not by comparison between the present data of the electronic parts which is mounted and the parts data which is already stored.

(4) It is possible to judge whether the hold of the electronic parts by the mounter is correct or not and how large the drift of the electronic parts is with respect to the predetermined position, by making use of the parts data. It is possible to mount the electronic parts at the predetermined position, adjusting the drift when mounting the parts thereto.

BRIEF DESCRIPTION OF THE DRAWINGS

In the accompanying drawings:

FIG. 3 is a table which shows the parts data;

FIG. 9(a) is a schematic view which shows the detection steps for the edge of the electronic parts;

FIG. 9(b) is a schematic view which shows the detection steps for the edge of the electronic parts;

FIG. 9(c) is a schematic view which shows the detection steps for the edge of the electronic parts;

FIG. 9(d) is a schematic view which shows the detection steps for the edge of the electronic parts;

FIG. 10(a) is a schematic view which shows steps for two divided dispositions;

FIG. 10(b) is a schematic view which shows steps for two divided dispositions;

FIG. 10(c) is a schematic view which shows steps for two divided dispositions.

FIG. 13(a) is a enlarged partially view of a lead, FIG. 13(b) is a schematic view of a chip on X-Y coordinates.

DESCRIPTION OF THE PREFERRED EMBODIMENT

Hereinafter, an embodiment of the present invention will be described with reference to figures.

Figure 1:
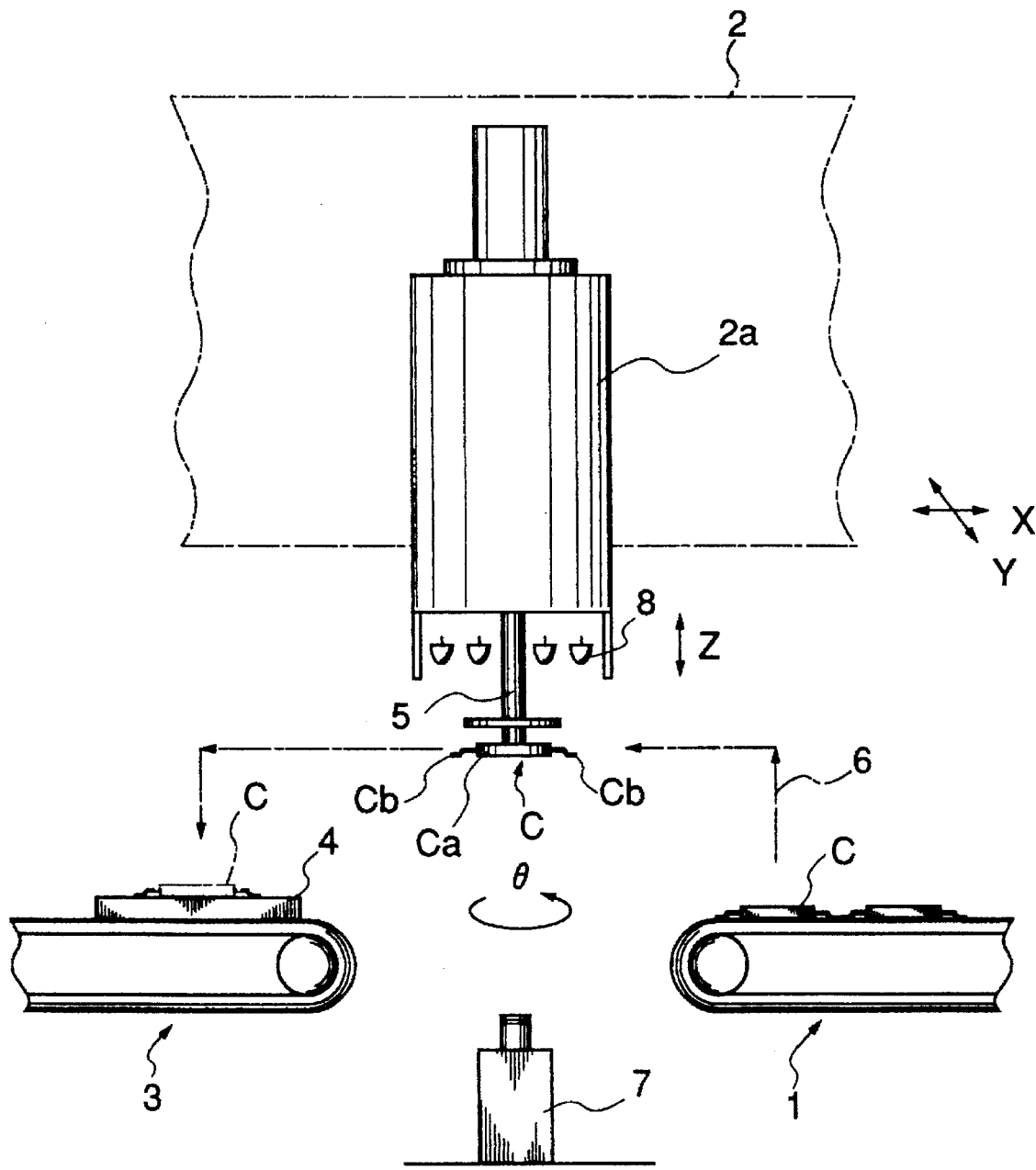
FIG. 1 is a schematic view which shows the mounter of the electronic parts in accordance with the embodiment of the present invention.
Figure 2:
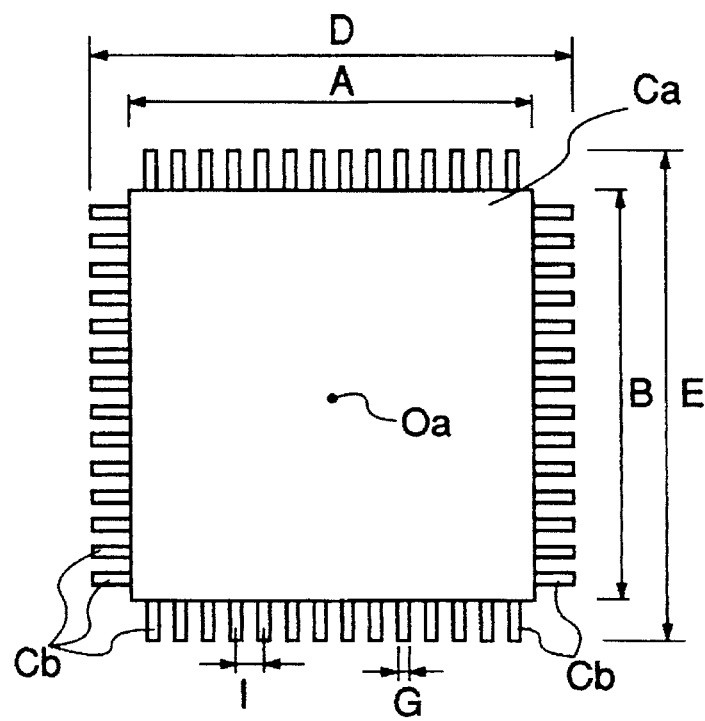
FIG. 2(a) is a front view which shows an example of the electronic parts.
FIG. 2(b) is a left side view thereof.
FIG. 2(c) is a bottom view thereof.
Figure 2:
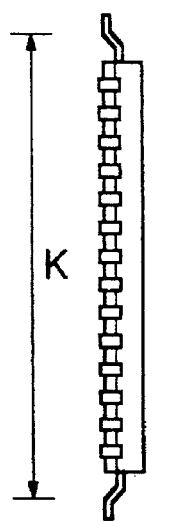
Figure 2:
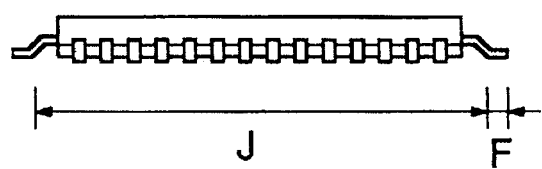

FIG. 1 is a schematic view which shows the mounting steps of chip (C) which are carried by a mounter 2 from a parts stage 3 on which the chip (C) is put, to a mounting stage 3. The chip (C) is formed by molding an IC chip in a package of resin, ceramic or the like. For example, as shown in FIG. 2, the chip (C) comprises the molded portion (Ca) and the leads (Cb) protruding from the outer circumference of the molded portion (Ca). The chip (C) is mounted on a printed circuit board 4 by the mounter 2.

The mounter 2 has a mount or transfer head 2a. The mount head 2a is provided with a vacuum bit 5, and an opening for the vacuum adsorption is formed at the lower edge face of the vacuum bit 5. The vacuum bit 5 adsorbs, as shown in FIG. 1, the chip (C) on the lower face thereof.

The mounter 2 moves between the parts stage 1 and the mounting stage 3 toward the (X) axis direction, and toward the (Y) axis direction, which is perpendicular to the (X) axis in horizontal plan. Further, the mount head 2a moves in the up and down direction, that is, in the (Z) axis direction; and rotates in the (θ) direction. Thus, the chip (C) is moved to the locus shown in FIG. 1, and is mounted on the printed circuit board 4.

A video camera (recording means) 7 for recording the chip (C) is arranged facing the mounter 2. The video camera 7 records the chip (C) in the state in which they are kept by the mount head 2a. When recording, the mounter 2 stops the mount of the chip (C) for the predetermined time. The mounter 2 is provided with lights 8 for transmitting illumination to the video camera 7.

Figure 4:
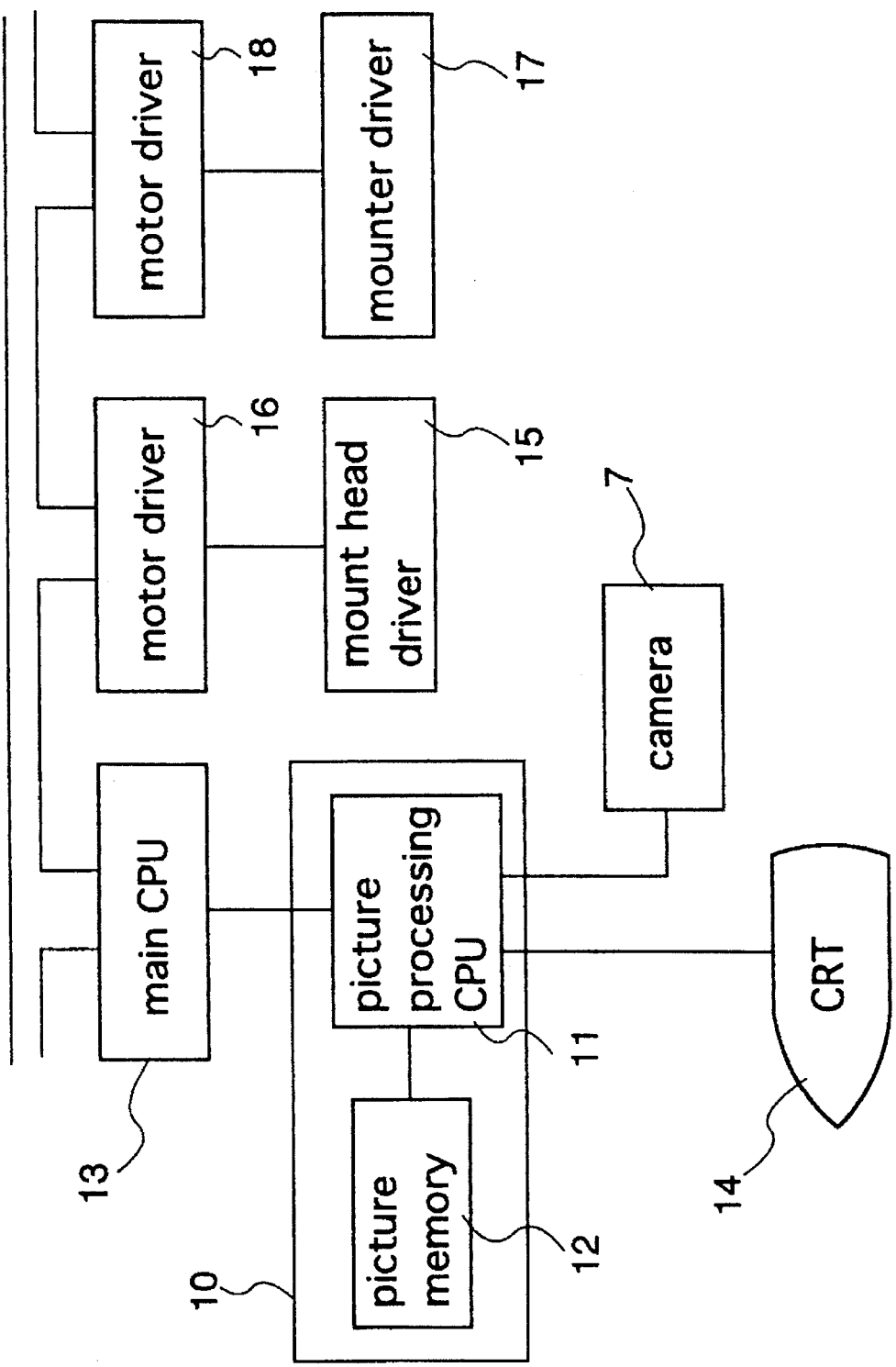
FIG. 4 is a block diagram which shows the control circuit of the mounter of the electronic parts.

FIG. 4 is a block diagram which shows the control circuit of the mounter 2 of the chip (C). As shown in FIG. 4, the picture information from the video camera 7 is signal processed into two dimensional picture data of one frame by a picture processing CPU 11 in a picture processing device 10. Two dimensional picture data of one frame is stored in a picture memory 12. The picture processing CPU 11 is connected to a main CPU 13, and to a CRT 14 for picture processing.

The control signal is transmitted from the main CPU 13, through a motor driver 16, to a mount head driver 15 for making the mount head 2a move, described as above, in the (Z) axis direction and the (θ) direction. The control signal is transmitted from the main CPU 13, through a motor driver 18, to a mounter driver 17 for making the mount head 2a move.

The picture information which is recorded by the video camera 7 as shown in FIG. 1 is stored in the picture memory 12, this picture information is processed by Steps S2~S4. Steps S2~S4 are described hereinafter. The parts data of the chip (C) which are mounted on the printed circuit board 4 is thereby obtained. For example, in the case of the chip (C) shown in FIG. 2, measurements which are indicated by the letters A~M in FIG. 2 and FIG. 3 are the parts data to be read.

Making the relationship between the sign and the parts data into a table, as shown in FIG. 3, the width (A) and the length (B) of the molded portion (Ca), the width (D) and the length (E) of the chip (C), the lead connecting face length (F), the lead width (G), the lead interval (I), the length (J), the width (K), the number of leads in width direction (L) and the number of leads in length direction (M) of the lead: are computed by the picture processing.

Figure 5:
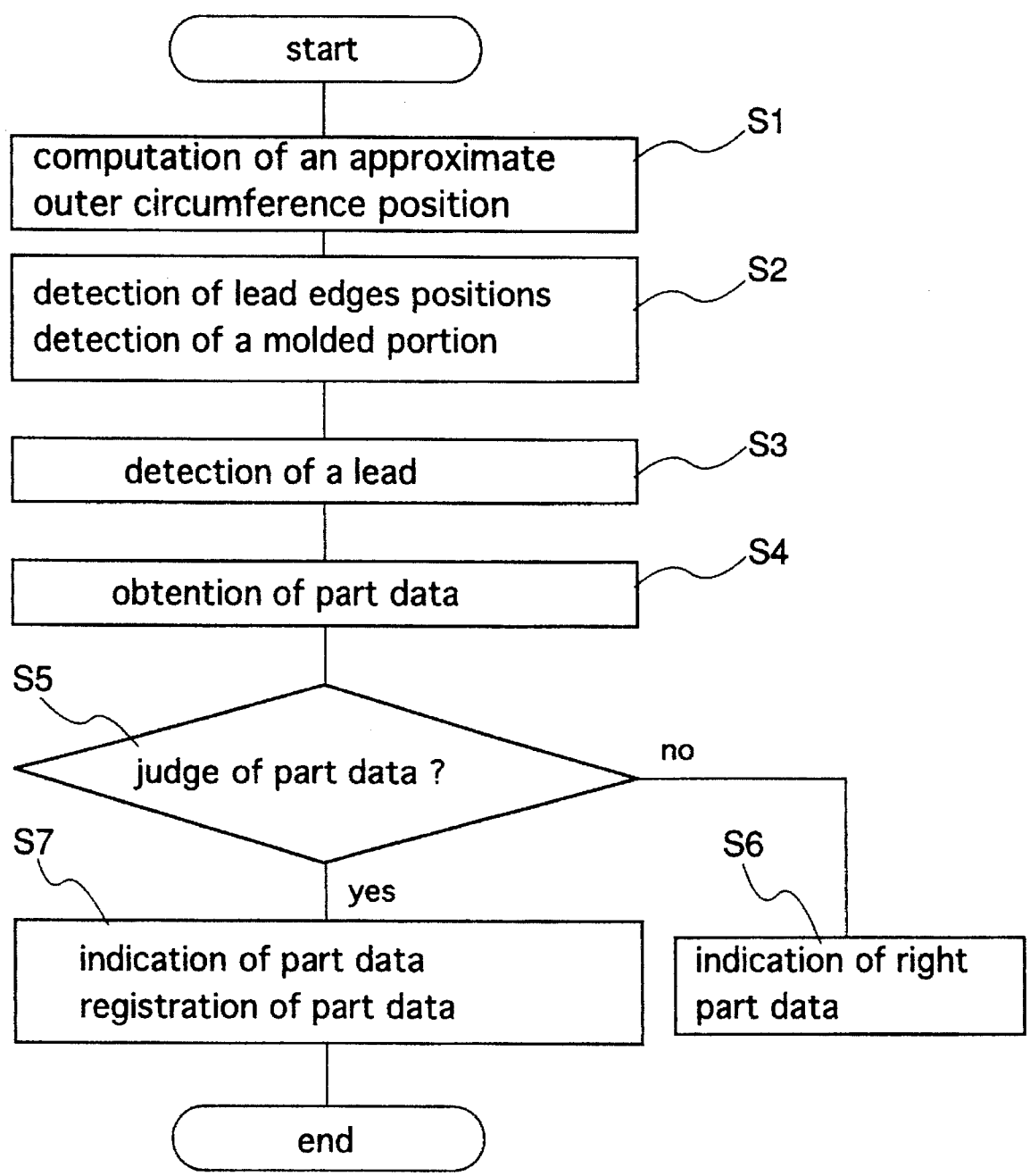
FIG. 5 is a main flow chart which shows Steps for storing of the parts data.
Figure 6:
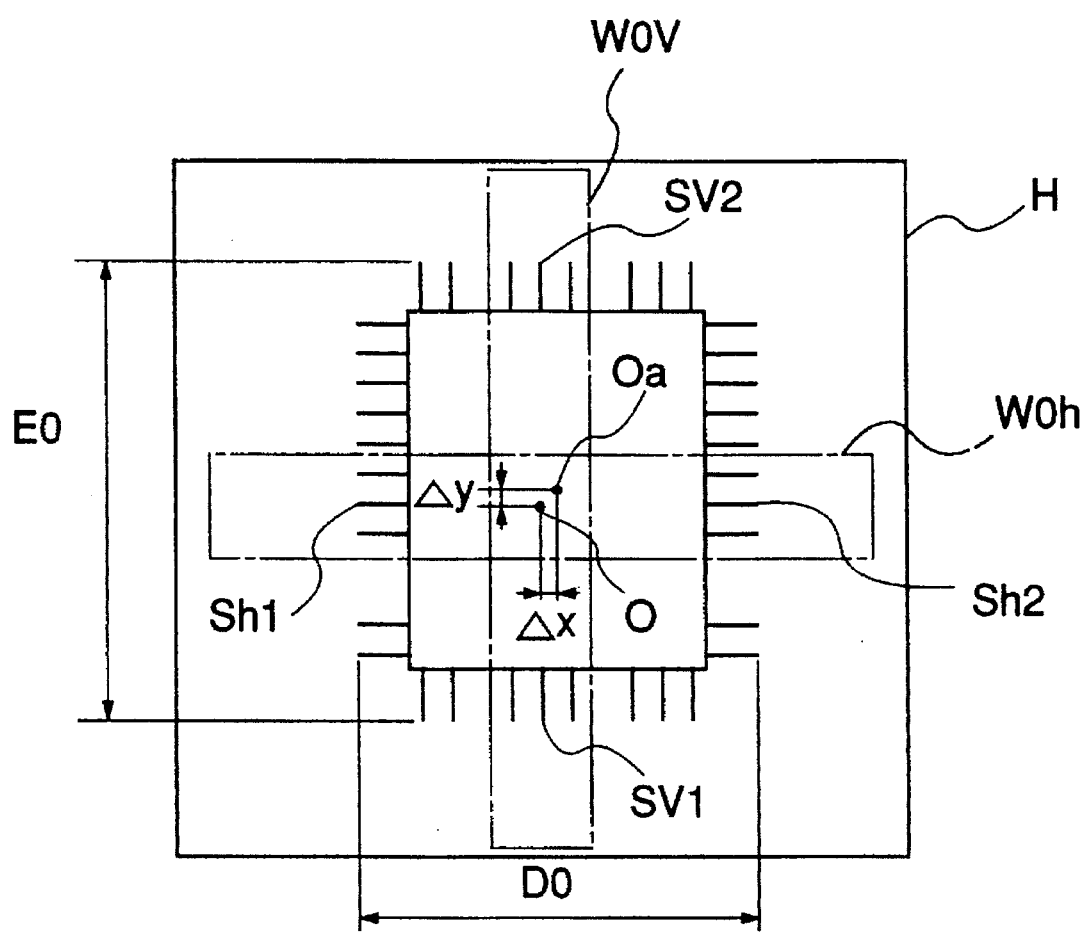
FIG. 6 is a schematic view which shows the measurement steps for the approximate outer circumference of the electronic parts.

FIG. 5 is a main flow chart which shows Steps for storing of the parts data. The first, in Step S1, the approximate outer circumference position and the temporary center position of the chip (C) is computed. In Step S1, as shown in FIG. 6, from the plane picture information (H) of one frame which is stored in the picture memory 12 the window $W_{0h}$ is read, the length of which is close to the width of the plane picture information (H) and the edge position $S_{h1}, S_{h2}$ of the outer circumference in the width direction is computed in conformity with the detecting of the edge of the plane picture information (H) in the picture memory 12. Likewise, the window $W_{0v}$ is read, the length of which is close to the length of the plane picture information H; the edge position $S_{v1}, S_{v2}$ of the outer circumference in the width direction is computed in conformity with the detecting of the edge of the plane picture information H.

In this way, the approximate outer circumference of the electronic parts is measured, so that the approximate width ($D_0$) and the approximate length ($E_0$) are computed in accordance with the positions of the edge of the outer circumference. The temporary values of the center position (Oa) of the chip (C) are computed in accordance with the temporary values.

Figure 7:
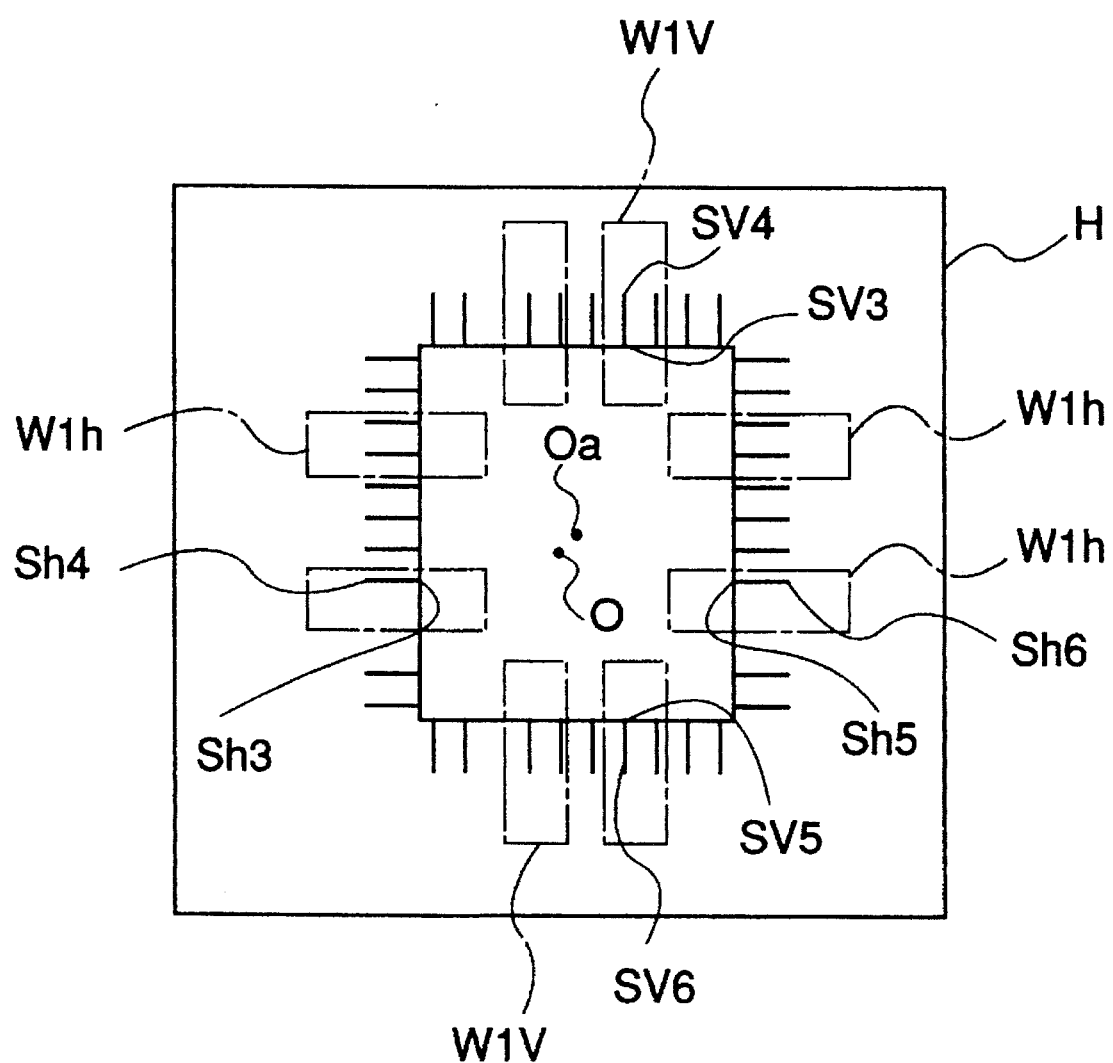
FIG. 7 is a schematic view which shows the measurement steps for the outer circumference portion of the electronic parts.

In Step S2, the positions of the lead edges and the position of the molded portion are detected. At this time, as shown in FIG. 7, the short window $W_{1h}$, corresponding to the position at which it is expected that the molded portion (Ca) might be present, in accordance with the approximate outer circumference position and the temporary center position (Oa) which are computed in Step S1, is loaded from the picture memory 12, so that the position $S_{h3}, S_{h5}$ of the side end face of the molded portion (Ca) and the top positions $S_{h4}, S_{h6}$ of the lead (Cb) are detected in conformity with the edge detection of the window $W_{1h}$. In the same way, the short window $W_{1v}$ is read, and the position $S_{v3}, S_{v5}$ of the length end face of the molded portion (Ca) and the top position $S_{v4}, S_{v6}$ of the lead (Cb) are detected.

In accordance with the above values, the width (A),(D) and the length (B),(E) of the molded portion (Ca) of the chip (C) as shown in FIG. 2 and FIG. 3 are computed.

Figure 8:
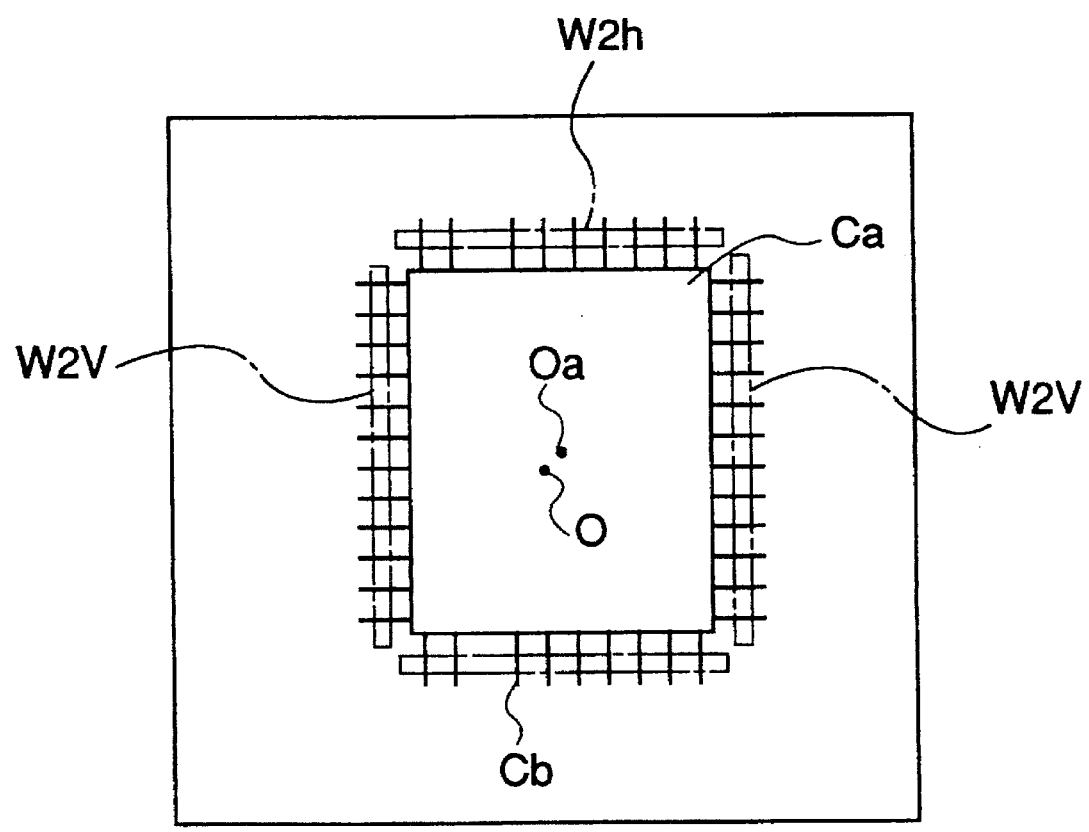
FIG. 8 is a schematic view which shows the measurement steps for the lead of the electronic parts.

Next, Step S3 is executed, and as shown in FIG. 8, the picture information corresponding to the lead (Cb) is loaded from the parts data which is computed in Step S2, so that the windows $W_{2v}, W_{2h}$ for the lead (Cb) are extracted. The lead connecting face length (F), the lead width (G), the lead interval (I), the length (J), the width (K), the number of leads (L) in the length direction and the number of leads (M) in the width direction, as shown in FIG. 3, are computed in accordance with positions of the lead edge in the windows $W_{2v}, W_{2h}$.

FIG. 9(a)~(d) are schematic views which show the detection steps for the edge of the electronic parts. As shown in FIG. 9(a), the data in the $W_{2h}$ is converted to one dimensional data (a projection process), and the edge positions are detected therefrom. The light and shade data as shown in FIG. 9(b) is obtained. The peak values (P) as shown in FIG. 9(c) are computed by a filtering process, and the edge as shown in FIG. 9(d) is computed from the peak values (P). Steps for computing the edge are adopted in not only the lead (Cb), but also in the molded portion (Ca).

A projection process is conducted to compute the average value of the edge positions. The projection process is done by shifting the position of the window $W_{2h}$ toward the arrow, as shown in FIG. 9(a).

The parts data obtained in this manner is processed in the memorable data in Step S4. Further, in Step S5, the parts data is judged as to whether the electronic parts is correct or not by comparison between the present parts data and the parts data which is already stored in the picture memory 12 as described above.

In the case in which the present parts data is inaccurate, that is, the electronic parts is broken, for example, the lead is missing, an error is indicated on a CRT 14 in Step S6. In the case in which the present parts data is accurate, the present parts data is indicated on CRT 14 and the present parts data is stored in Step S7. The parts data is stored in an other memory medium such as a floppy disk and the like as well, not in the picture memory 12.

In the case in which the chip (C) is rotated in horizontal plane, an initial angle ($\theta_i$) can be required by a following method.

Figure 13:
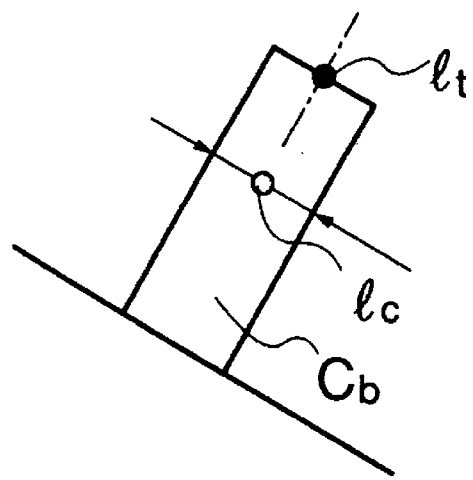
FIGS. 13(a) and 13(b) are descriptive views of enquiring a method of ($\theta_i$)
Figure 13:
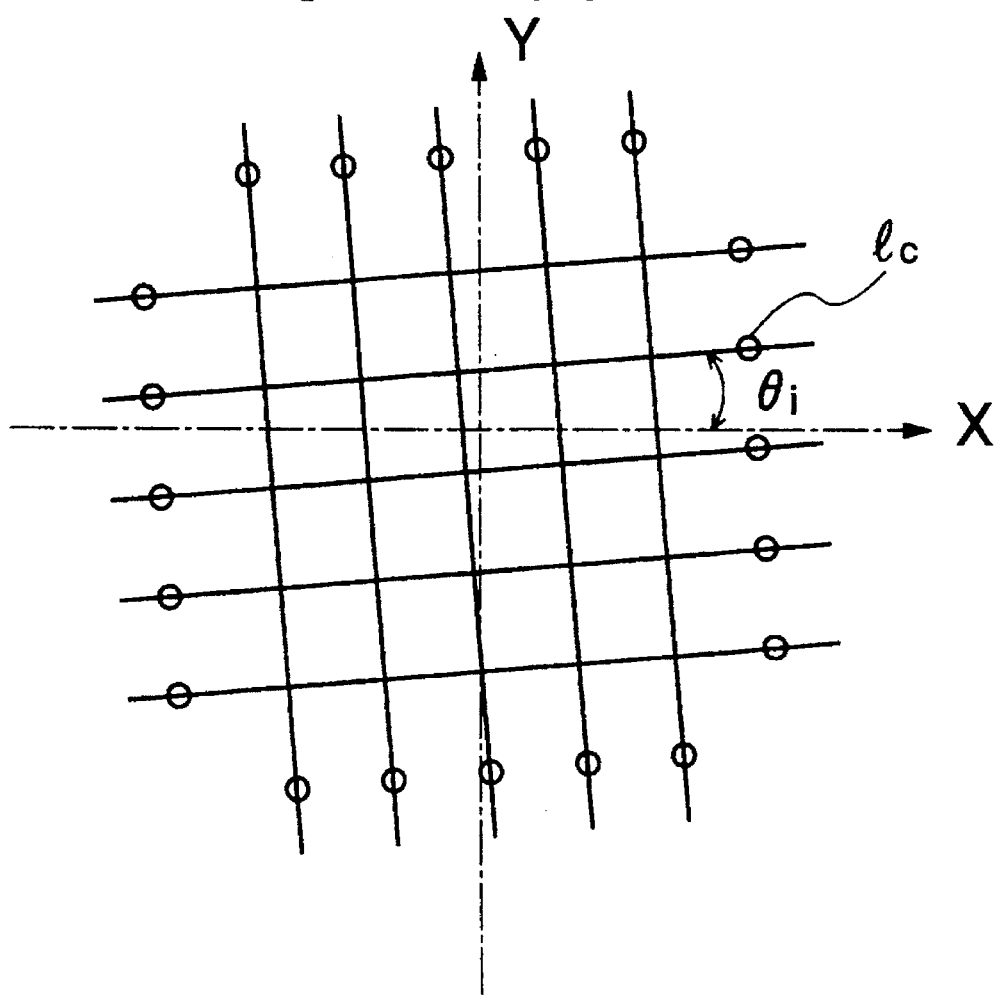

Each lead top ($l_t$) and lead center ($l_c$) as shown in FIG. 13(a) are detected.

Next, two lead centers ($l_c$) corresponding to each other in approximate X axis direction and Y axis direction, which are connected to each other, each straight line.

Next, Average of (A) is derived from Yn=AnX+Bn, and ($\theta_i$) can be required from averaging (A):

$$\text{average of } (A) = 1/n(\Sigma An).$$

Further, New parts data is not extracted after the parts data was extracted in the first place. However, the credibility of the first parts data is low. As a countermeasure of the low credibility, there is an averaging method by repeating the extraction of the parts data several times. In this case, the credibility of the parts data is confirmed whether each sample data such as the lead interval (I) is a normal distribution or not. When the sample data is in the out of a normal distribution, the credibility of which is confirmed to be low, and thus the sample data is dealt as an invalid data.

Further, even in the case in which the chip (c) is defective when extracting the parts data therefrom, it is possible to judge it to be defective. The defective such as a broken lead chip, a bent lead chip is judged to be defective. In a special case, the information data which means "this IC is a missing lead IC" is imputed by a manual operation in order that an other broken lead IC in a normal state, (a "missing lead IC" and the like) is recognized as a normal part. The missing lead IC is judged to be a normal parts.

In the embodiment described as above, the picture information of the whole of the chip (C) is recorded by the video camera 7, and is read. However, in the case in which the chip (C) is large, the picture of the chip (C) do not the lens of the video camera 7. In this case, it is also possible to divide the picture in to two or four pictures.

FIG. 10(a)~(c) are schematic views which show Steps for two divided disposition. FIG. 10(a) shows the measurement steps for the approximate outer circumference of the chip (C) by making the long wind. FIG. 10(b) is a view which shows the measurement steps for the outer circumference of the chip (C) by making the short window, the measurement of the lead (Cb) is done by making the window for the lead as shown in FIG. 10(c). In the case of a two-division method, the other side is disposed as well.

Figure 11:
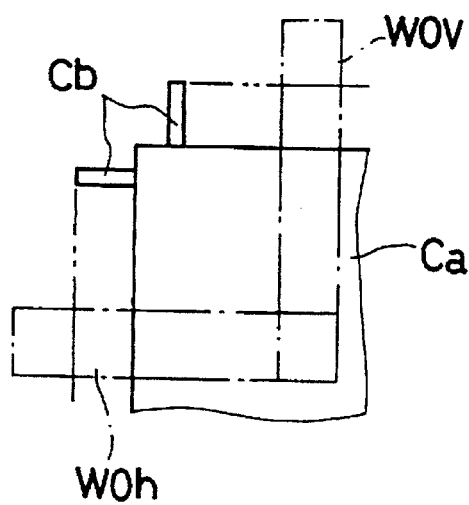
FIG. 11(a) is a schematic view which shows steps for four divided dispositions.
FIG. 11(b) is a schematic view which shows steps for four divided dispositions.
FIG. 11(c) is a schematic view which shows steps for four divided dispositions.
Figure 11:
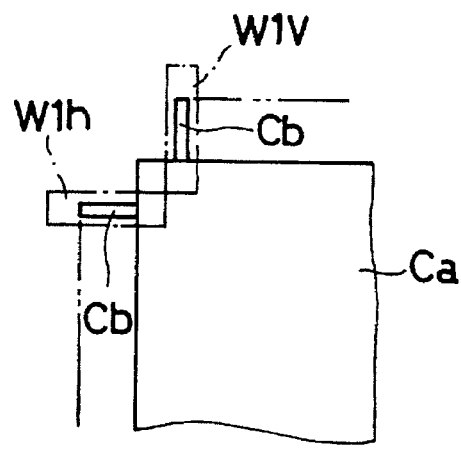
Figure 11:
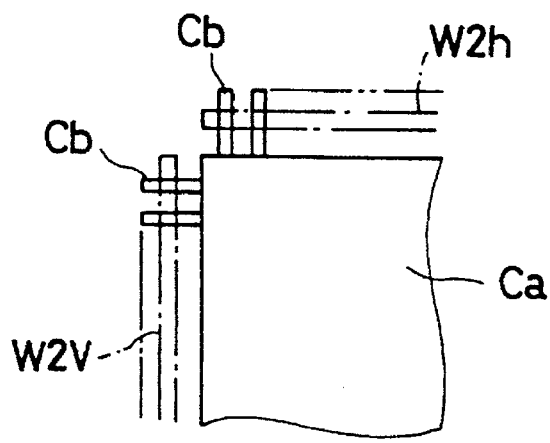

FIG. 11(a)~(c) are schematic views which show Steps for a four-division disposition. The parts data is computed by making the window which is the same as the window in case described above.

The decision whether to employ division, two divisions or a four division disposition is directed by the keying of the operator.

All of the kinds of parts data of the chip (C) which should be mounted using the mounter 2 as shown in FIG. 1 are stored in the memory. When the chip (C) is mounted on the printed circuit board 4 by the mount head 2a from the parts stage 1 to the mounting stage 3, the kind of chip (C) held by the mounter 2 is determined. Further, the chip (C) are in a state to be held by the mount head 2a, then the drift of the parts with respect to the mount head 2a is detected. The drift of the chip (C) with respect to the mount head 2a is adjusted in accordance with these results when the chip (C) are mounted on the printed circuit board 4.

FIG. 7–FIG. 9 shows that the chip (C) are held in a state in which the center (Oa) thereof has drifted with respect to the center (O) of the vacuum bit 5 by ($\Delta X$) in the (X) axis direction and ($\Delta Y$) in the (Y) axis direction.

In such a case in which the parts are held in a drifted state, in the process in which the chip (C) are carried by the mount head 2a from the parts stage 1 to the mounting 3, the picture information of the chip (C) is recorded by the camera, and the drift is computed therefrom, so that it is possible to adjust the position of the chip (C) with respect to the mount head 2a.

As shown in FIG. 6, when the center (Oa) of the chip (C) drifts with respect to the center (O) of the vacuum bit 5, the quantity of the drift in the (X) axis direction is ($\Delta X$) and the quantity of the drift in the (Y) axis direction is ($\Delta Y$), and each of the drift quantities ($\Delta X$), ($\Delta Y$) is computed by the main CPU 13. Further, in the case in which the chip (C) are in a state of rotation from an accurate position, the rotating drift quantity ($\Delta \theta$) thereof is computed by the main CPU 13. The adjusting values are computed in accordance with the drift quantities, so that the adjustment of the mount head 2a is done when the chip (C) are mounted on the printed circuit board 4.

Figure 12:
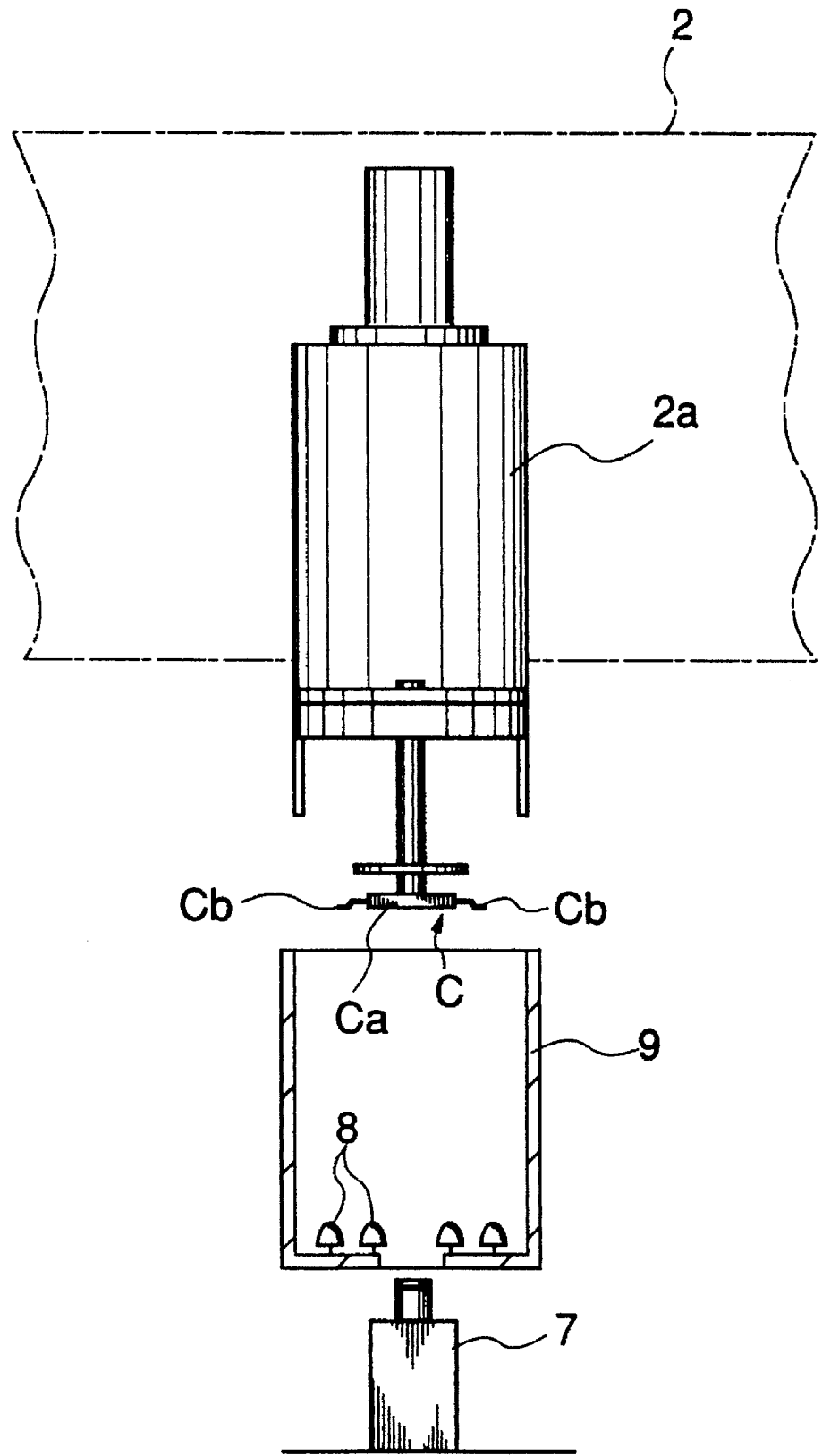
FIG. 12 is a schematic view which shows the light in accordance with the other embodiment of the present invention.

FIG. 1 shows the case in which the lights 8 is provided at the mounter 2 side, so that transmitted illumination is carried out. As shown in FIG. 12, a leading light cylinder having the light therein is also provided between the video camera 7 and the mounter 2. In this case, it is possible to record a picture of the electronic parts such as LCC which can be recorded accurately by the reflected illumination.

Hereinbefore, the present invention was described concretely in accordance with the embodiment. The present invention is not limited into the embodiment, in so far as the essence of the invention is not deviated from, it goes without saying that the present invention can be modified.

For example, the present invention can be adopted to not only GFT, SOP, QFP, MISSING LEAD IC, LCC and the like, but also to many kinds of electronic parts.

Further, it is also possible to use a camera instead of a video camera.

What is claimed is:

1. A mounting device comprising:
    a transfer head for transporting mounting an electronic component having a molded portion on a printed circuit board automatically, having a vacuum nozzle adapted for holding the electronic component;
    a recording means for taking a picture of the electronic component held by the vacuum nozzle by using a camera before the electronic component is mounted on the printed circuit board;
    a data computing means for measuring the size of each part of the electronic component to obtain parts data, which is necessary for specifying the kind of electronic component, based on the picture of the electronic component obtained by said recording means,
    said data computing means also computes the approximate outer circumference position and the temporary center position of the electronic component based on the picture of the electronic component to compute the approximate width, the approximate length and the temporary value of the center position of the electronic component, and detects the positions of lead edges and the position of the molded portion of the electronic component by using the approximate outer circumference position and the temporary center position to compute the width and the length of the molded portion and the same of the whole of the electronic component, and further computes the data as to the lead in accordance with the width and the length of the molded portion and the same of the whole of the electronic component,
    and said data computing means also reads a long window, from the picture of the electronic component, the length of which is close to the width of the picture and computes an edge position of the outer circumference in the width direction in conformity with detection of the edge in the window, and reads a long window the length of which is close to the length of the picture of the electronic component and computes an edge position of the outer circumference in the length direction in conformity with detection of the edge in the window, whereby it computes the approximate width, length and the temporary value of the center position of the electronic component,
    a data storing means for storing obtained parts data of the electronic component;
    whereby all the kinds of parts data of electronic components to be mounted on the printed circuit board are obtained by the recording means and the data computing means and are stored in the data storing means, and whereby parts data of an electronic component held by the nozzle are compared with the pre-stored parts data, thereby parts held by the nozzle are judged to be accurate or not.

2. The mounting device in accordance with claim 1 wherein:
    said data computing means reads a short window in the width direction corresponding to the position at which it is expected that the molded portion might be present in accordance with the approximate outer circumference position and the temporary center position so that the position of the side end face of the molded portion and the top positions of the lead are detected in conformity with the edge detection of the window, and reads a short window in the length direction so that the position of the length end face of the molded portion and the top positions of the lead are detected in conformity with the edge detection of the window, thereby it computes the width and the length of the molded portion and the same of the whole of the electronic component.

3. The mounting device in accordance with claim 2 wherein:
    said data computing means reads windows for the lead in the width and the length direction as to the lead portion in accordance with the width and the length of the molded portion and the same of the whole of the electronic component, thereby it computes the data as to the lead in accordance with positions of the lead edge in the windows.

4. The mounting device in accordance with claim 3 wherein:
    said data computing means computes a peak value by a filtering process of light and shade data appearing in the windows for the lead, and computes an edge position from the peak value.

5. The mounting device in accordance with claim 4 wherein:

said data computing means conducts a projection process to compute the average value of edge positions.

6. The mounting device in accordance with claim 3 wherein:

said parts data as to the lead includes at least the number of leads.

7. The mounting device in accordance with claim 6 wherein:

said parts data as to the lead includes the lead length, the lead width, the lead interval, the number of leads in the length direction and the number of leads in the width direction.

8. The mounting device in accordance with claim 1 wherein:

said recording means takes pictures of the electronic component by dividing the picture, in case the electronic component is large and beyond a picture, then the data computing means obtains parts data from the divided pictures.

* * * * *